United States Patent
Hsiao

(10) Patent No.: US 8,500,377 B2
(45) Date of Patent: Aug. 6, 2013

(54) CONTAINER DATA CENTER

(75) Inventor: Sheng-Chung Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 73 days.

(21) Appl. No.: 13/270,235

(22) Filed: Oct. 11, 2011

(65) Prior Publication Data

US 2012/0319544 A1  Dec. 20, 2012

(30) Foreign Application Priority Data

Jun. 20, 2011 (TW) .............................. 100121425 A

(51) Int. Cl.
*B60P 3/16* (2006.01)
(52) U.S. Cl.
USPC ............................................................ 410/33
(58) Field of Classification Search
USPC ...................................................... 410/87, 33
See application file for complete search history.

(56) References Cited

U.S. PATENT DOCUMENTS

| | | | | |
|---|---|---|---|---|
| 3,833,280 | A * | 9/1974 | Bell ............................... | 312/107 |
| 3,964,612 | A * | 6/1976 | Skilliter et al. .................. | 211/26 |
| 4,934,764 | A * | 6/1990 | Leitermann et al. .......... | 312/111 |
| 5,749,137 | A * | 5/1998 | Martin ............................ | 29/434 |
| 6,102,219 | A * | 8/2000 | Wang ............................ | 211/194 |
| 6,443,542 | B1 * | 9/2002 | Lindquist et al. ............. | 312/198 |
| 6,678,161 | B1 * | 1/2004 | Claprood et al. ............. | 361/724 |
| 6,938,966 | B1 * | 9/2005 | Rouwhorst .................... | 312/111 |
| 6,955,410 | B1 * | 10/2005 | Nelson et al. ................. | 312/352 |
| 2005/0200244 | A1* | 9/2005 | Rouwhorst .................... | 312/111 |
| 2009/0229194 | A1* | 9/2009 | Armillas ........................ | 52/79.1 |
| 2010/0139887 | A1* | 6/2010 | Slessman ........................ | 165/67 |
| 2011/0157829 | A1* | 6/2011 | Wormsbecher et al. ....... | 361/701 |
| 2011/0315714 | A1* | 12/2011 | Sand .............................. | 222/173 |
| 2012/0013141 | A1* | 1/2012 | Cheng .......................... | 296/24.3 |

* cited by examiner

*Primary Examiner* — H Gutman
(74) *Attorney, Agent, or Firm* — Altis Law Group, Inc.

(57) ABSTRACT

A container data center includes a container, and two spaced cabinets arranged in the container. A supporting apparatus is connected between the cabinets. The supporting apparatus includes two connecting members and an operation member. The first ends of the connecting members are fixed to the corresponding cabinets. The second ends of the connecting members are connected to opposite ends of the operating member. The operating member can be lengthened or shortened by rotation.

14 Claims, 3 Drawing Sheets

CONTAINER DATA CENTER

CROSS-REFERENCE OF RELATED APPLICATIONS

Relevant subject matter is disclosed in two pending U.S. patent applications, both titled "CONTAINER DATA CENTER", with the application Ser. Nos. 13/237,951 and 13/244,624, respectively, filed on Sep. 21, 2011, and Sep. 25, 2011, respectively, which are assigned to the same assignee as this patent application.

BACKGROUND

1. Technical Field

The present disclosure relates to a container data center.

2. Description of Related Art

A container data center includes a container, and a number of cabinets each holding one or more servers and received in the container. However, during transportation of the container data center, the servers may be damaged due to vibrations or shocks.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
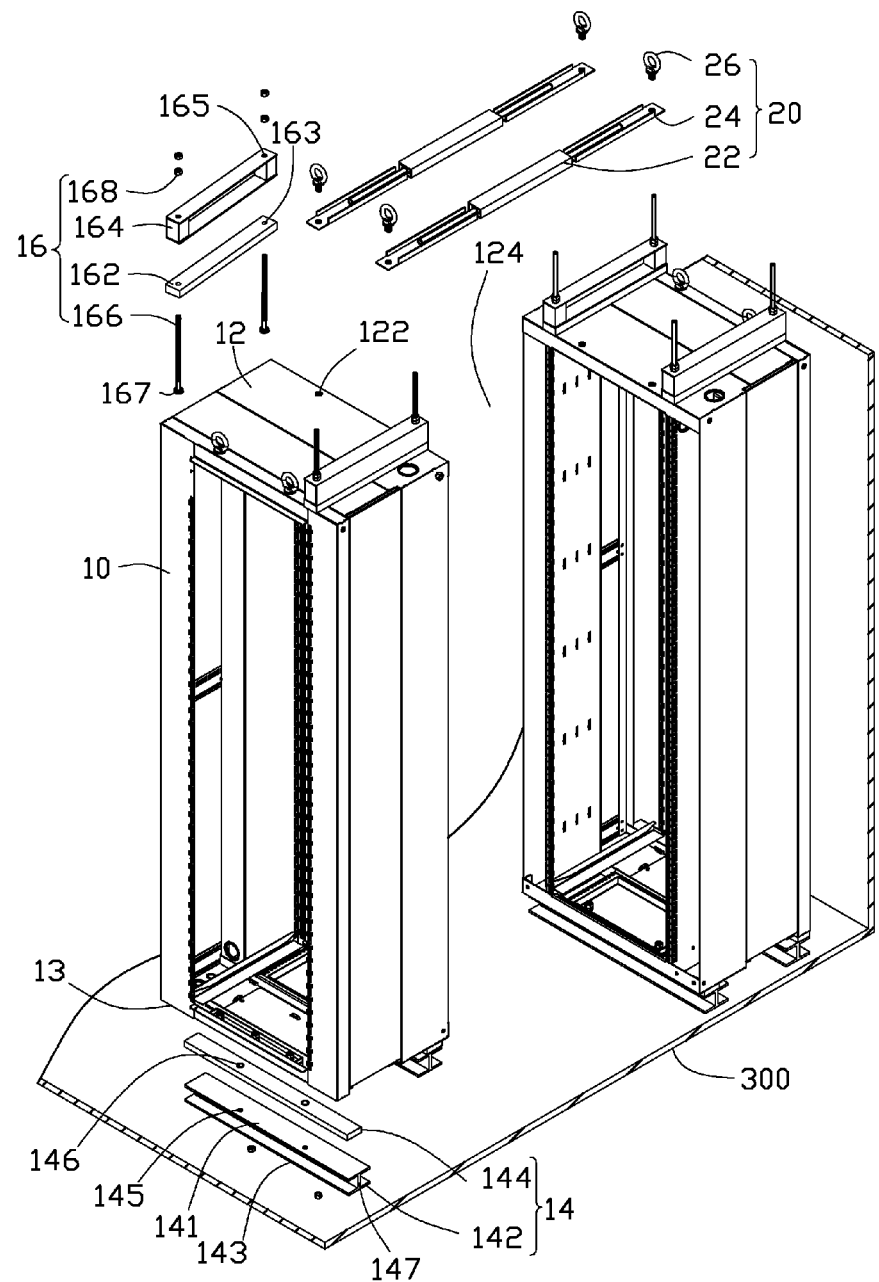
FIG. 1 is an exploded, isometric view of an embodiment of a container data center, wherein the container data center includes a plurality of supporting apparatuses.

Referring to FIG. 1, an embodiment of a container data center includes a container 300, two spaced cabinets 10 arranged in the container 300, and a pair of supporting apparatuses 20 installed between the cabinets 10. Each cabinet 10 includes a top wall 12 and a bottom wall 13 opposite to the top wall 12. A pair of first shockproof devices 14 is mounted to the underside of the bottom wall 13, and a pair of second shockproof devices 16 is mounted to the top of the top wall 12. The side of the top wall 12 of each cabinet 10 which is closest to the other cabinet 10 defines two fastening holes 122. One or more servers may be installed in each cabinet 10.

Each first shockproof device 14 includes a H-section support 142 and a first shockproof member 144.

The support 142 is made up of a long bottom plate 143, a long top plate 141 parallel to the bottom plate 143, and a connecting plate 147 perpendicularly connected between the centers of the bottom plate 143 and the top plate 141. The top plate 143 defines two fixing holes 145, to one side of the connecting plate 147.

The first shockproof member 144 is made of shockproof material, such as plastic or rubber. The first shockproof member 144 is a bar, substantially equal in length to the top plate 141. The first shockproof member 144 defines two through holes 146.

Each second shockproof device 16 includes a long second shockproof member 162, a long latching block 164, two screws 166, and a plurality of nuts 168. In the embodiment, the second shockproof member 162 is made of shockproof material, such as plastic or rubber.

Two through holes (stepped holes 163) are defined at the ends of the second shockproof member 162. The stepped hole 163 has a large diameter at the bottom of the second shockproof member 162, and a smaller diameter at the top of the second shockproof member 162.

Two through holes are defined at the ends of the latching block 164. The length of the latching block 164 is substantially equal to the length of the second shockproof member 162.

Each screw 166 includes a head 167 extending from one end of the screw 166. The large diameter portion of the stepped hole 163 is slightly larger than the diameter of the head 167.

Figure 2:
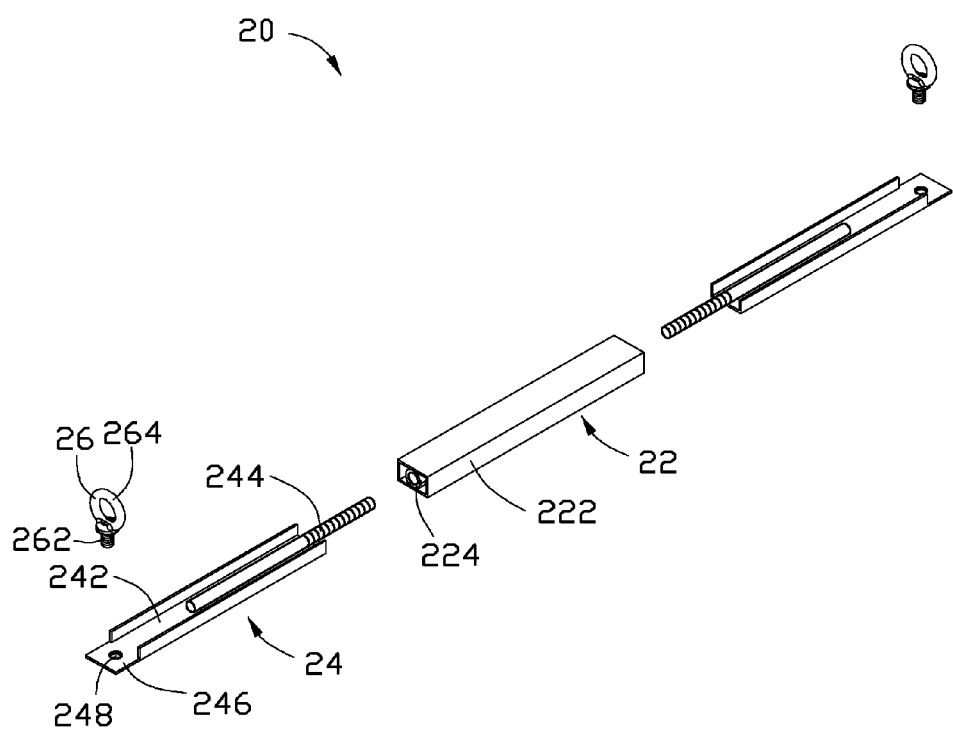
FIG. 2 is an exploded, isometric view of one of the supporting apparatuses of FIG. 1.

Referring to FIG. 2, each supporting apparatus 20 includes an operation member 22, two connecting members 24, and two fastening members 26. In the embodiment, the fastening members 26 are eye bolts, wherein the lower portion is threaded (bolt 262) and the upper portion is an unbroken ring (annular operation portion 264).

Each operation member 22 is a bar, and includes a tubular operation pole 222, and an inner-threaded fixing portion 224 fixed in each end of the operation pole 222. One the fixing portion 224 defines a right hand thread, and the other fixing portion defines left hand thread. In the embodiment, the fixing portions 224 function as nuts, and the axes of the nuts are coaxial with each other.

Each connecting member 24 includes a bar-shaped connecting plate 242 and a connecting pole 244 mounted on top of the connecting plate 242. The connecting plate 242 includes a fastening portion 246 at one end, and the fastening portion 246 defines a through hole 248. The connecting pole 244 is mounted on the other end of the connecting plate 242, and the length of the pole 244 which is not in contact with the connecting plate 242 is threaded, to suit a portion 224. In the embodiment, the joint between the connecting pole 244 and the connecting plate 242 is permanent.

Figure 3:
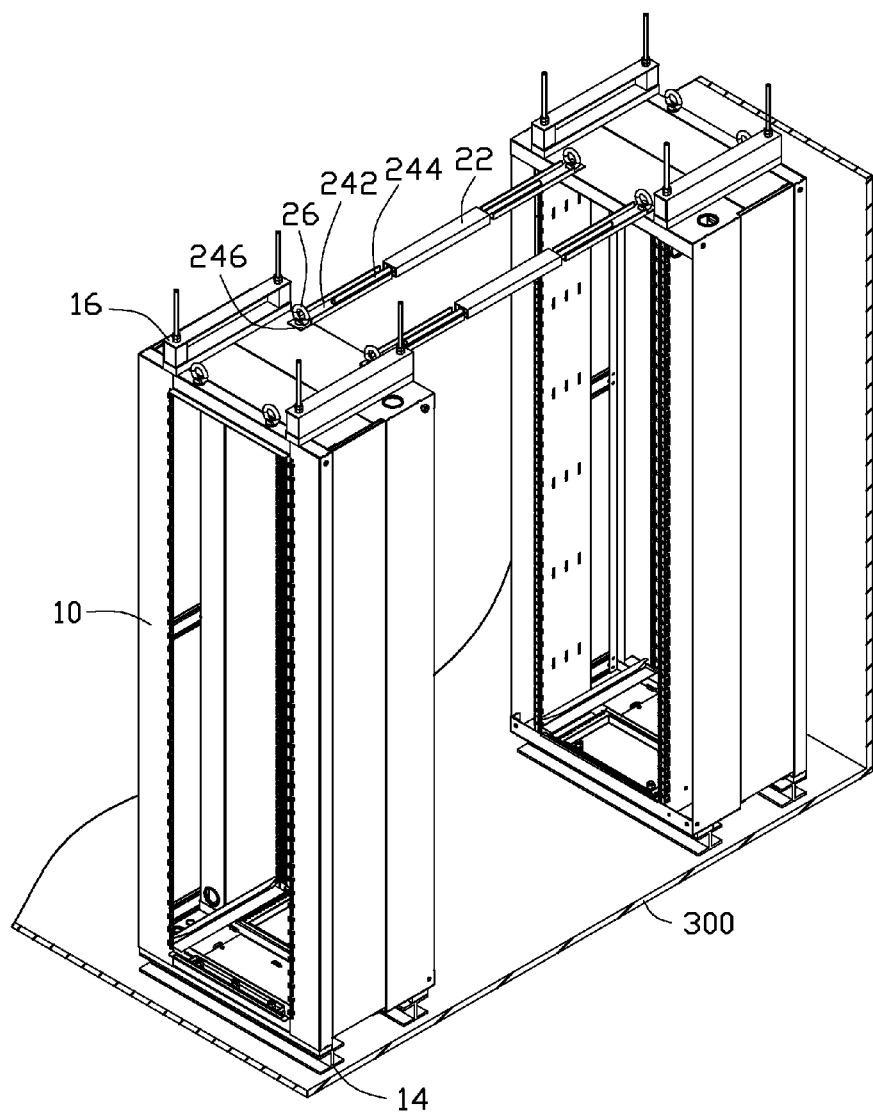
FIG. 3 is an isometric view of the assembled container data center of FIG. 1

Referring to FIG. 3, in assembly, the support 142 is fixed on the bottom of the container 300. The first shockproof devices 14 are mounted to the bottom of the bottom wall 13. Screws extend through the through holes of bottom wall 13, the through holes 146, and the fixing holes 145, to be screwed into the corresponding nuts. Thereby, the first shockproof devices 14 are mounted on the bottom of the bottom wall 13. The heads of the screws 166 are sunk in the large diameter portion of the stepped holes 163 and the screws 166 extend through the second shockproof member 162, the through holes 165, and the nuts 168, to be screwed into the top of the container 300. An airflow channel 124 is formed between the cabinets 10. The second shockproof member 162 can be made to abut the top wall 12 by adjusting the length of the screws 166 through the top of the container 300.

In assembling each supporting apparatus 20 to the cabinets 10, the connecting pole 244 of the connecting member 24 is screwed into a connecting portion 224. The connecting members 24 are respectively rotated to adjust the length of the supporting apparatus 20, allowing the through holes 248 to align with the two corresponding fastening holes 122 of the cabinets 10. The bolts 262 extend through the through holes 248, to be screwed into the fastening holes 122. The supporting apparatus 20 is thus connected between the top walls 12 of the cabinets 10, across the airflow channel 124, to lock the cabinets 20 laterally in pairs, preventing any fore and aft movement of the cabinets 20 and increasing the resistance of the pair to shocks and vibration.

It is to be understood, however, that even though numerous characteristics and advantages of the embodiments have been set forth in the foregoing description, together with details of the structure and function of the embodiments, the present disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A container data center comprising:
   a container;
   two spaced cabinets arranged in the container; and
   a supporting apparatus detachably installed between the cabinets, wherein the supporting apparatus comprises two connecting members and an operation member, first ends of the connecting members are fixed to the cabinets, and second ends of the connecting members are connected to two opposite ends of the operation member;
   wherein the second ends of the connecting members are screwed to the two opposite ends of the operation member.

2. The container data center of claim 1, wherein a length of the second end of each connecting member in the operation member is adjustable.

3. The container data center of claim 1, wherein the operation member comprises a tubular operation pole, and two inner-threaded fixing portions formed at two opposite ends of the operation pole, each connecting member comprises a connecting pole, and the second end of the connecting pole is threaded to be screwed to a corresponding one of the fixing portions.

4. The container data center of claim 3, wherein the fixing portions are two nuts, and mounted to the operation pole by welding, two axes of the nuts are coaxial with each other.

5. The container data center of claim 3, wherein each connecting member further comprises a connecting plate, the first end of the connecting pole is fixed on the connecting plate.

6. The container data center of claim 5, wherein the supporting apparatus further comprises two fastening members, a top of each cabinet defines a fastening hole, the connecting plate defines a through hole opposite to the connecting pole, the fastening members extend through the through holes of the connecting plates, to be screwed into the fastening holes.

7. The container data center of claim 6, wherein the fastening member comprises a bolt and an operation portion extending up from a top of the bolt.

8. The container data center of claim 1, wherein a first shockproof device is mounted to the bottom of each cabinet, the first shockproof device comprises a bracket fixed to the container and a first shockproof member sandwiched between the cabinet and the bracket, the first shockproof device is made of shockproof material.

9. The container data center of claim 8, wherein a second shockproof device is mounted to a top of the container, the second shockproof device comprises a second shockproof member, a latching block, and a plurality of nuts, a plurality of screws extends through the second shockproof member, the latching block, and the corresponding nuts, to be screwed into the top of the container, a length of the screws in the top of the container is adjustable to allow the second shockproof member to abut against or move away from the cabinet, the second shockproof device is made of shockproof material.

10. The container data center of claim 1, wherein an airflow channel is formed between the cabinets, the supporting apparatus extends across the airflow channel.

11. A container data center comprising:
    a container;
    two spaced cabinets arranged in the container; and
    a supporting apparatus detachably installed between the cabinets, wherein the supporting apparatus comprises two connecting members and an operation member, first ends of the connecting members are fixed to the cabinets, and second ends of the connecting members are connected to two opposite ends of the operation member;
    wherein a first shockproof device is mounted to a bottom of each cabinet, the first shockproof device comprises a bracket fixed to the container and a first shockproof member sandwiched between the cabinet and the bracket, and the first shockproof device is made of shockproof material.

12. The container data center of claim 11, wherein a second shockproof device is mounted to a top of the container, the second shockproof device comprises a second shockproof member, a latching block, and a plurality of nuts, a plurality of screws extends through the second shockproof member, the latching block, and the corresponding nuts, to be screwed into the top of the container, a length of the screws in the top of the container is adjustable to allow the second shockproof member to abut against or move away from the cabinet, and the second shockproof device is made of shockproof material.

13. The container data center of claim 11, wherein a length of the second end of each connecting member in the operation member is adjustable.

14. The container data center of claim 11, wherein an airflow channel is formed between the cabinets, and the supporting apparatus extends across the airflow channel.

* * * * *